US005138528A

United States Patent [19]

Altman et al.

[11] Patent Number: 5,138,528

[45] Date of Patent: Aug. 11, 1992

[54] ELECTRICAL PACKAGING SYSTEM AND COMPONENTS THEREFOR

[75] Inventors: Barry E. Altman, West Chester; Albert Casciotti, Hershey; George R. Schmedding, Hummelstown, all of Pa.

[73] Assignee: AMP Incorporated, Harrisburg, Pa.

[21] Appl. No.: 652,804

[22] Filed: Feb. 6, 1991

[51] Int. Cl.[5] .......... H05K 7/20

[52] U.S. Cl. .......... 361/400; 361/377; 361/403; 174/DIG. 2; 439/86; 362/221; 362/265

[58] Field of Search .......... 361/377, 397, 398, 400, 361/403, 405, 413; 174/DIG. 2; 362/217, 221, 265; 439/86, 87, 88, 89, 90, 91

[56] References Cited

U.S. PATENT DOCUMENTS

| | | | |
|---|---|---|---|
| 3,514,590 | 5/1976 | Shaeffer | 362/221 X |
| 3,818,279 | 6/1976 | Seeger, Jr. et al. | 361/398 |
| 4,820,170 | 4/1989 | Redmond et al. | 439/66 |
| 4,867,689 | 9/1989 | Redmond et al. | 439/71 |
| 4,885,662 | 12/1989 | Bartholomew et al. | 361/413 X |
| 4,922,376 | 5/1990 | Pommer et al. | 361/400 X |
| 4,969,070 | 11/1990 | Costa | 362/221 |

FOREIGN PATENT DOCUMENTS

| | | | |
|---|---|---|---|
| 2312183 | 12/1976 | France | 439/86 |

*Primary Examiner*—Leo P. Picard
*Assistant Examiner*—Paramita Ghosh

[57] ABSTRACT

An electrical packaging system, preferably a fluorescent lamp assembly, includes an assembly (10) having a housing (12) with a planar base (14) carrying affixed thereto a flat, flexible circuit (50) with holes (52) exposing conductors (56). Spacially disposed components (28, 40) are affixed to the housing with terminals extending to bear against a resilient conductive member (38, 44) to interconnect components to the circuit. The conductive medium may be bonded to either the terminals or to the circuit to facilitate handling.

10 Claims, 3 Drawing Sheets

ELECTRICAL PACKAGING SYSTEM AND COMPONENTS THEREFOR

This invention relates to an electrical packaging system and components therefor wherein component terminals and circuit conductors are interconnected through a conductive elastomeric medium.

BACKGROUND OF THE INVENTION

Electrical and/or electronic assemblies are typically formed of components which are interconnected by electrical conductors such as wire and cable and physically mounted on a frame to provide a given end function. The frame may serve as a housing, or part of a housing to hold the components in a desired spacial relationship. Computer, communication gear, appliances of all types are thus constructed with components ranging from power supplies to key boards, switches, displays, timers, heater elements, and a variety of functioning devices. The means of interconnecting such components typically include harnesses formed of discrete wires or cables of wires, or in certain instances rigid or flexible etched circuits. The spacial relationship of components coupled with the mounting thereof on frames has led to a practice of securing and mounting the components on the frame followed by interconnection with a flexible harness applied thereafter. Interconnections between components and circuits are achieved by connectors utilizing pin and socket electrical terminals, or solder, or the use of wire nuts which interconnect wire ends together. These are the typical practices employed for providing an interconnection of components in a housing or frame with appropriate circuits.

The present invention has as an object the provision of an improved packaging system for interconnecting components which reduces the labor of circuit interconnection and makes the installation of interconnections more reliable. A further object is to provide a packaging system for interconnecting components wherein the components are mounted mechanically to a frame having the circuit previously mounted thereto in a position to interconnect to component terminals. Still another object is to provide a frame, component and circuit assembly where the interconnections are made during assembly through a broad area of contact with an elastomeric conductive medium which is tolerance accommodating and facilitates assembly essentially along a single axis.

SUMMARY OF THE INVENTION

The present invention represents an improvement over the prior art of packaging electrical components and answers the foregoing objectives by utilizing a component housing made to have a mounting base with a planar area thereon containing a flexible circuit affixed to such base. The flexible circuit includes conductors disposed therein in a pattern extending over the base surface to correspond with the spacial disposition of components. The components are affixed to the base by mounting means and include terminals aligned with holes in the flexible circuit exposing selectively the conductors therein. A conductive resilient medium is interposed between the circuit conductors and component terminals to affect a broad area electrical interconnection therebetween held by the mechanical mounting of the components onto the frame to form a functional package.

In one embodiment, the conductive medium is bound to the flexible circuit selectively corresponding with the holes therein to facilitate mass production of circuits containing the conductive medium, handling and use of such circuits in production. In another embodiment, the conductive medium is bound to the terminals of the components.

The invention contemplates conductive mediums which are preformed into thin laminate elements which have anisotropic conductive characteristics or in forms which are coated compositions of elastomeric material loaded with conductive particles and/or fibers which coatings can be selectively applied either to the circuit in selective areas or to the terminals of components.

An illustrative embodiment of the invention discloses a fluorescent fixture including a metallic housing to which connectors are affixed along with component ballast and a flat flexible circuit interconnecting the connector components to the ballast with the components arranged spacially to provide an appropriate function in mechanically holding and electrically connecting the ends of fluorescent lamp tubes.

IN THE DRAWINGS

DETAILED DESCRIPTION OF THE INVENTION

Figures 1, 2, 3, 4:
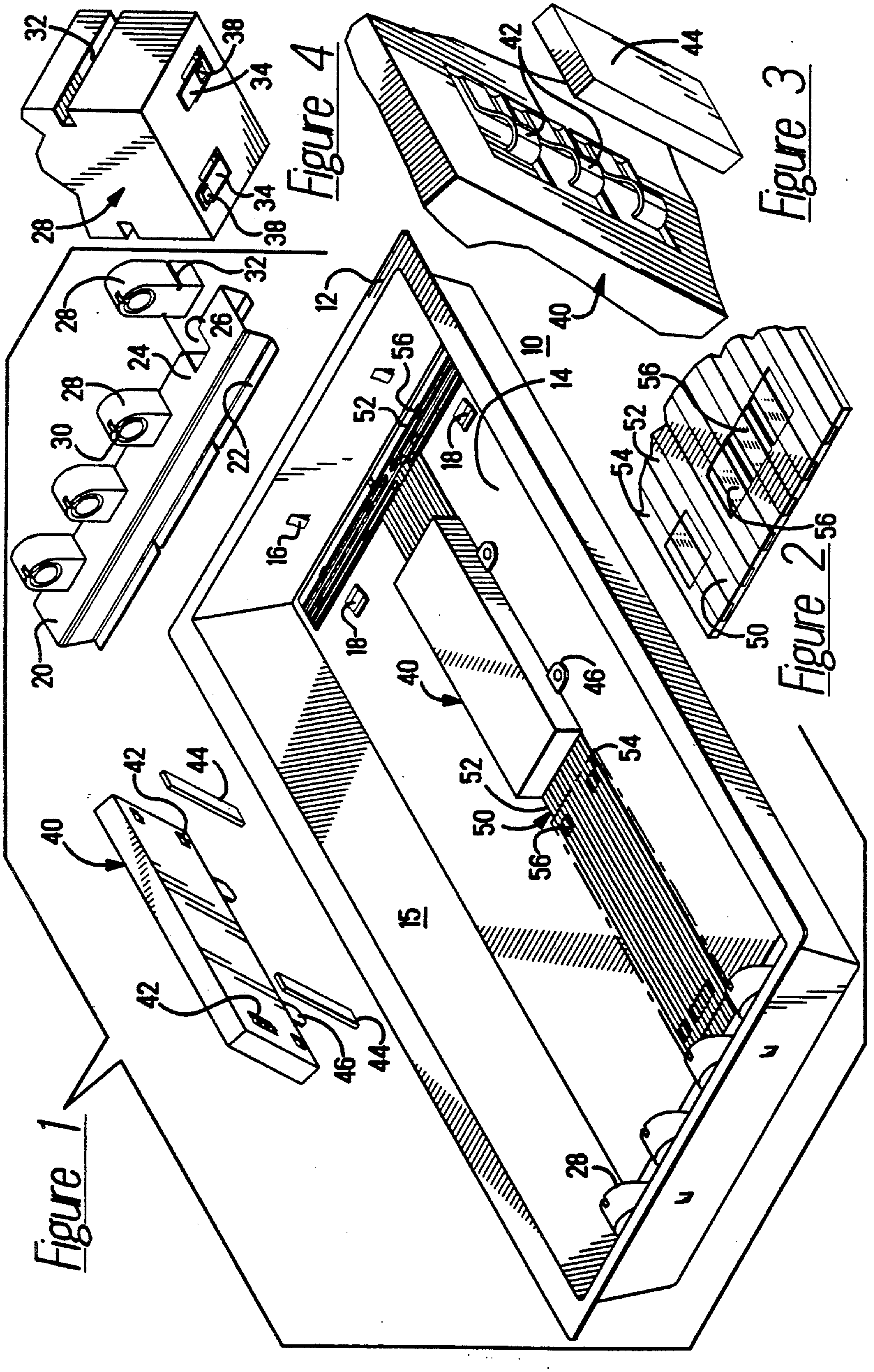
FIG. 1 is a perspective and partially exploded view of an exemplary system according to this invention.
FIG. 2 is a perspective and partial view of a portion of the circuit shown in FIG. 1.
FIG. 3 is a perspective, considerably enlarged view showing the contact terminals of one of the components shown in FIG. 1.
FIG. 4 is a partial perspective view of the end of one of the components shown in FIG. 1.

Referring now to FIG. 1, there is shown an assembly 10 in the form of a fluorescent light fixture intended to illustrate the invention packaging system of this invention. The fixture 10 includes a housing 12 having a central planar base 14 surrounded by sidewalls 15. The housing 12 may be formed of thin sheet metal suitably protectively coated or of thin plastic material. Fasteners 16 and 18 are attached to the walls of the housing or formed therefrom by knockouts to receive, retain and mechanically hold brackets such as 20 within housing 12. The bracket 20 shown in FIG. 1 includes edges 22 which fit within the fasteners 18 and an upper flat surface 24, the edge of which fits beneath the latches 16. This allows the bracket 20 to be slipped into the housing and locked therein, the ends thereof bearing against the walls 15 as the bracket is snapped into place. The bracket 20 further includes a series of reliefs 26, one such being shown in FIG. 1, each of a dimension and position to receive a component 28 which in the illustrative embodiment is a fluorescent tube connector. The component 28 includes in a side face a groove 30 leading to the interior of the component and further along the sides a pair of grooves 32 of a dimension to receive the edges of the frame along the relief 26 holding the connector component in position within frame 20. Interior of the component housing are electrical terminals (not shown) which are mounted in a well-known manner to receive the pins of fluorescent tubes inserted within 30 and rotated to be resiliently engaged and interconnect the tube circuits as well as mounting the tubes physically in a desired position within the housing 12. To be noted in FIG. 1 are additional component tube connectors 28 opposite those to the right of FIG. 1.

Also shown in FIG. 1, disposed mounted against the base 14 and exploded therefrom are a pair of components 40 which in the illustrative embodiment are ballasts which operate to convert line power to an appropriate current and voltage level for driving the fluorescent tubes. Each of the ballasts 40 includes an array of electrical terminals 42 extending from the under surface thereof, there being three terminals 42 shown in a row with respect to the ballasts shown exploded from the base 14 in FIG. 1. FIG. 3 shows the terminals 42 in greater detail and the presence of a conductive medium 44, which will serve in a manner to be described to interconnect the terminals 42 to conductors in a flat, flexible circuit 50 disposed on base 14. The components 40 further include a means for fastening the components to the housing in the form of feet 46 having an aperture 48 to receive fasteners such as sheet metal screws and the like to secure the ballasts firmly to the base 14 and thereby to the housing 12.

The flat, flexible circuit 50 includes the series of spaced conductors 52 extending there along and insulated by a non-conductive medium 54. Selectively disposed in the circuit 50 are a series of holes 52 in the insulating medium which expose the conductors 56. These holes may be die cut or formed by lasar ablation or other suitable methods. As can be discerned from FIG. 1, the holes 52 are in patterns to interconnect with component terminals at the spacial location of such components with respect to the circuit 50 and the housing 12.

Figure 5:
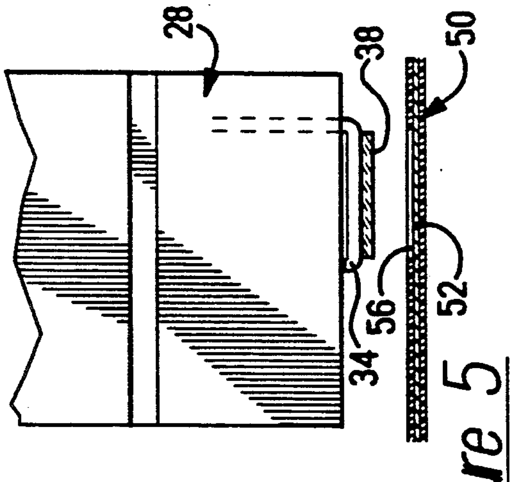
FIG. 5 is a side, elevational, and partially sectioned view of the component shown in FIG. 4.

Referring now to FIGS. 4 and 5, the components 28 may be seen to include a pair of terminals 34 projecting from the bottom surface thereof. These terminals extend across the bottom of the components to extend over and transect the various conductors 56 of the circuit 50. Additionally included is a resilient conductive medium 38, which in practice is interposed between the surfaces of the terminals and the surfaces of conductors 56 so that when the components are mounted within the housing, the terminals will compress the conductive medium 38 to effect an interconnection with a given conductor 56 wherever a hole 52 is located. As can be seen in FIGS. 4 and 5, the conductive medium is made coextensive with the terminals 34 and 36 and in accordance with this embodiment is made of anisotropic material, one that conducts in a single direction. U.S. Pat. No. 4,820,170 is drawn to a layered elastomeric connector which includes alternating fused layers of a dielectric elastomer and electric conductive fibrous mats. U.S. Pat. No. 4,867,689 shows an elastomeric connector assembly utilized to connect between a pair of components and including a camming means to compress the elastomeric connector to provide a reliable electrical interconnection. The aforementioned patents teach an elastomeric connector suitable for the present application. In accordance with a preferred practice, the elastomeric connector would be sliced into pads of an area extending across the bottom of the component 28 or in the case of the component 40 extending across the row of terminals 42 with the conductive orientation extending between the terminals and the conductors 52 as exposed by holes 56.

The invention further contemplates that alternative conductive mediums such as coatings selectively applied by silk screening or other techniques may be employed utilizing resilient material embedded with conductive particles, fibers, platelets or other materials to a degree making the material sufficiently conductive. Such coatings may be restricted to pads individual to the terminals and may be non-anisotropic It is pointed out that the interface between the conductors of terminals 34, 36 and 42, when utilized with an elastomeric medium, is one which is of a relatively broad area characteristic rather than the typical point or asperity resulting from the interface of metallic terminals and conductors directly. Asperity contact is typically a fraction of a square mil, broad area contact being many square mils. The conductive medium in the form of elastomeric connector or coating should be sufficiently thick to accommodate tolerance variations in either the terminals or conductors of the cable or the positioning thereof, considering the preferred practice of causing such terminals and conductors to be compressed together by virtue of the mounting in the housing of components and circuits. In a preferred embodiment, the elastomeric connector is on the order of about 0.020 to 0.030 inches in thickness.

Figure 6:
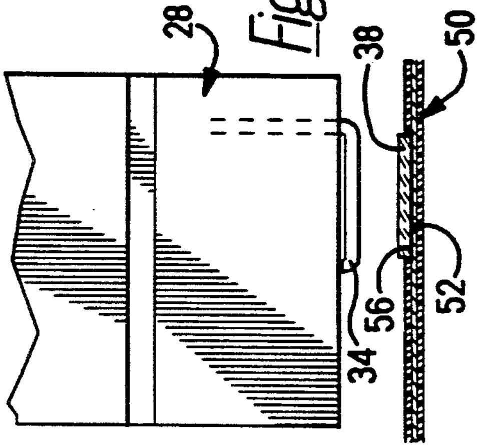
FIG. 6 is a side, elevational, and partially sectioned view of an alternative embodiment of the component shown in FIG. 4.

The invention also contemplates utilizing an elastomeric element or coating which is bound to the surface of either the terminals 34 and 42 or bound to the surface of the circuit 50 in the region of the holes 52. A suitable conductive adhesive may be employed to bind the elastomeric element to the terminal or circuit. FIGS. 5 and 6 show these two embodiments prior to closure of the components against the circuits. FIG. 5 shows the conductive medium 38 bound to the terminal 34 and FIG. 6 shows the conductive medium 38 bound to the circuit 50; both operable upon closure to cause a relatively broad area of contact between the conductors 52 and the terminals. In like manner, the conductive medium may be utilized with respect to the components 40 and the terminals 42.

The invention thus contemplates a housing having a planar base containing a circuit having holes therein in a pattern related to the spacial positioning to the components, components such as 28 and 40 with the fastening or fixturing of the components to the housing resulting in an electrical interconnection as well as a mechanical interconnection of components to housing and to a circuit contained within the housing.

Figure 7:
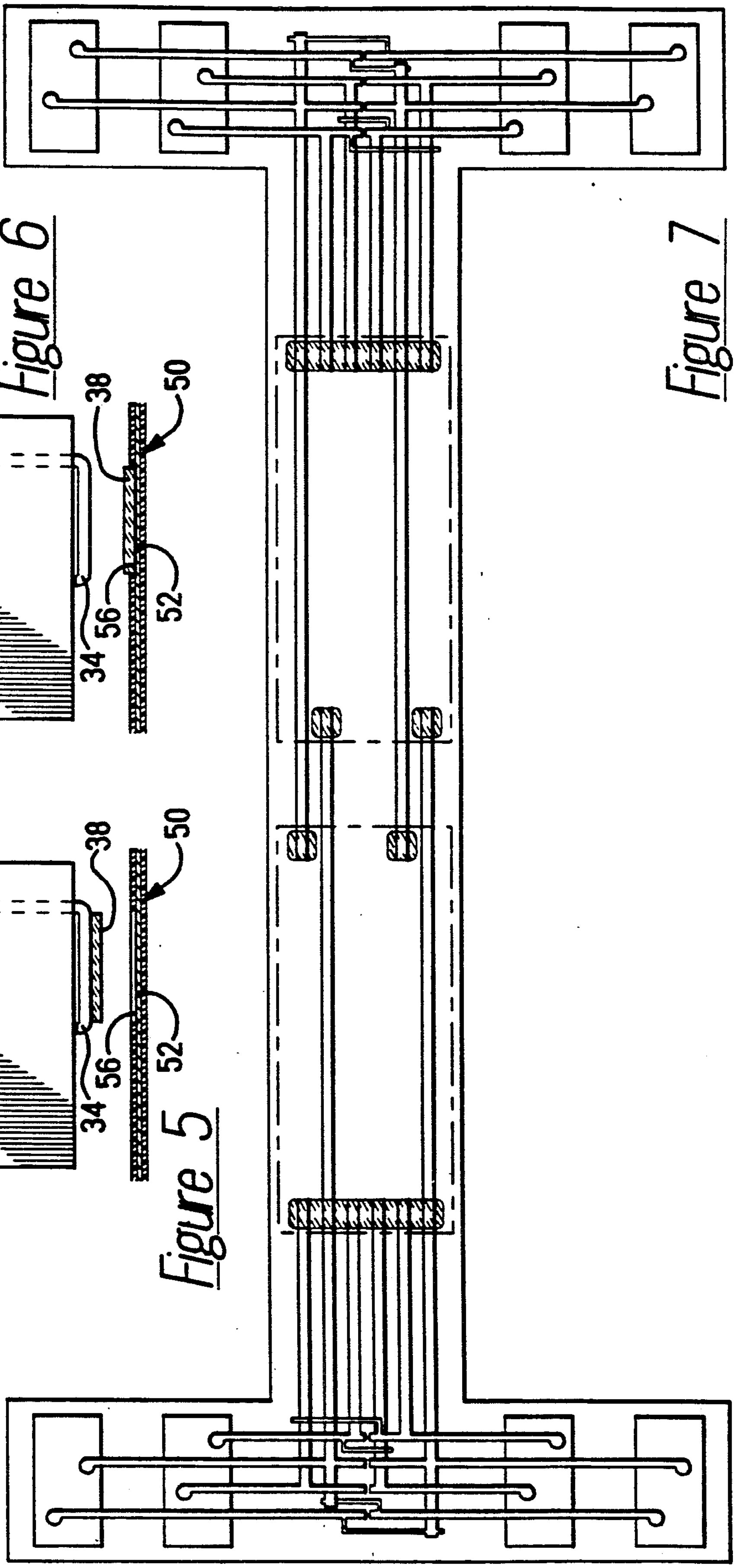
FIG. 7 is a plan view of the circuitry of an alternative, such as may be formed by an etched circuit on a plastic sheet.
Figure 8:
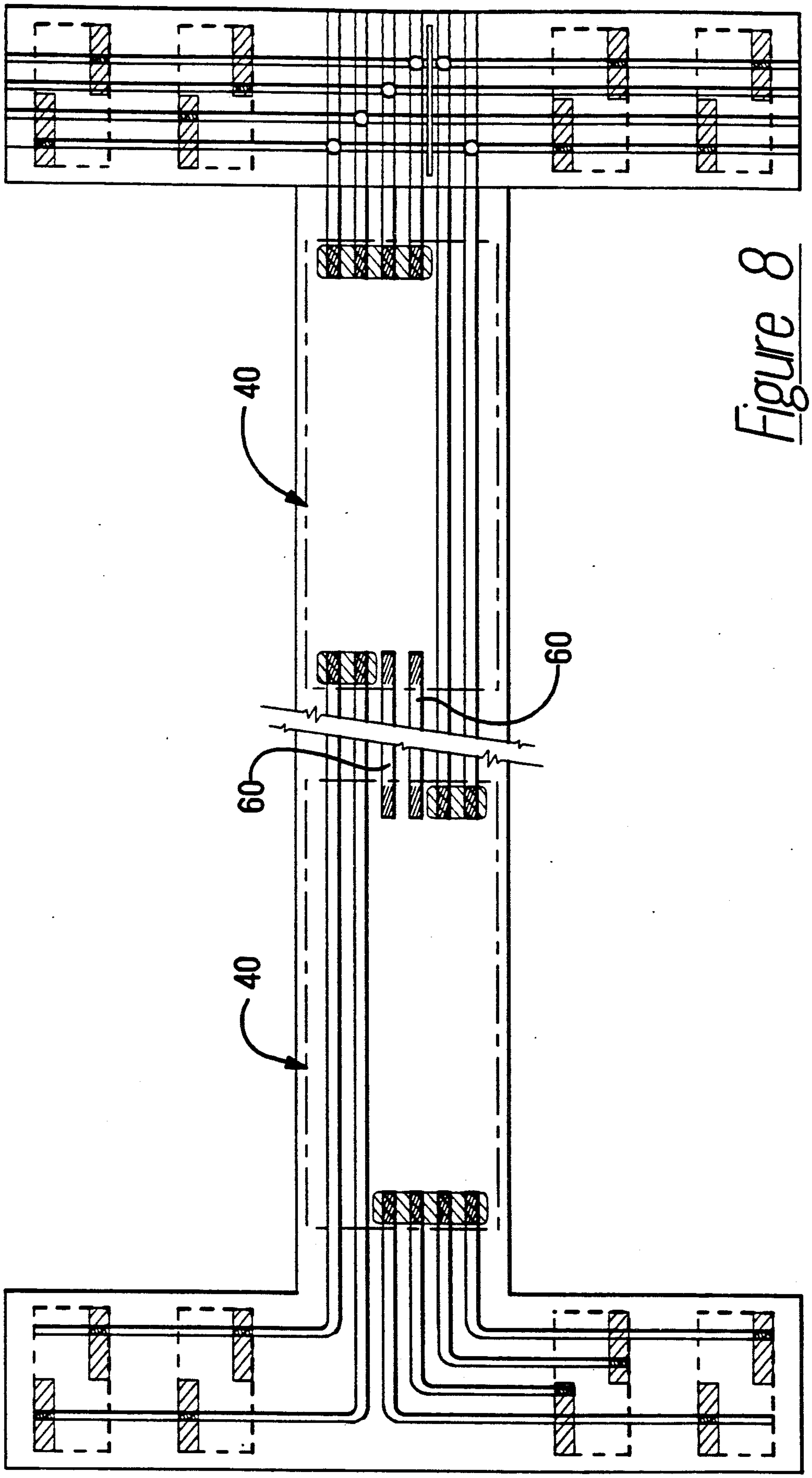
FIG. 8 is a simplified plan view similar to FIG. 7, showing the circuitry for a multi-conductor cable, illustrating at one end a T-splice and at the other end a split cable.

The invention further contemplates the use of a variety of circuits, of a variety of configurations ranging from etched, see FIG. 7 for an exemplary illustration, or additively formed conductive patterns on plastic sheets suitably laminated to define the desired pattern of circuit for spacially attaching to components in a housing, or solid or stranded wires formed in extruded or laminated cable, or a flat, continuous multi-conductor cable that is folded upon itself, such as at a right angle, to avoid a splicing of wires at a T-splice to accommodate components 28. For the preferred use of flat multi-conductor cable, reference is made to FIG. 8. For this embodiment, a T-splice with the circuitry thereof has been illustrated at the right hand side. While a comparable electrical connection would be made at the other end, for convenience a split cable is shown. Additionally, for convenience, the split cable may have the respective sections folded over at essentially a 90° angle. The ballasts 40 are shown in outline form with the electrical connections designated therein. The two internal conductors 60 may, for example, provide the line power to the ballasts 40.

In each of the above cases, the use of the resilient elastomeric medium enhances the interconnection by providing broad area contact with the conductors regardless of the geometry, flat, round, solid or stranded in and only in the area where holes in the insulating medium are provided.

We claim:

1. An electrical packaging system for providing a mechanical mounting and electrical interconnection of a series of electrical components at spacial locations defining a given function comprising a housing having a base including a planar area, an exposed planar circuit affixed to said base extending over said area, said circuit including a series of electrical conductors contained in an insulating medium with a series of holes exposing the said conductors selectively at component locations in said area, a series of said components each including a plurality of electrical terminals extending therefrom and means mounting said components directly to said base to align the terminals thereof with the holes in said circuit to provide a functional disposition of components and circuit on said base, a yieldable conductive member extending between each terminal of a component and a conductor through the associated hole in said insulating medium and compressively held to provide a broad area of electrical contact between terminal and conductor held by said mounting means, and means within said circuit to provide electrical power thereto.

2. The system of claim 1 wherein the said conductive member is an elastomeric material containing conductive elements positioned therein to define anisotropic flow of current therethrough, where said medium is made coextensive with the plurality of terminals of said component.

3. The system of claim 1 wherein the said conductive member is coextensive with the area of a single terminal of a component.

4. The system of claim 1 wherein the said conductive member is bound to the terminals of a component.

5. The system of claim 1 wherein the said conductive member is bound to the said circuit proximate to the holes therein.

6. The system of claim 1 wherein the said conductive medium is an elastomeric material coated on the said terminals to provide a relatively broad area of contact.

7. The system of claim 1 wherein the said conductive member is a thin flexible sheet member.

8. The system of claim 1 wherein the said housing is a housing for fluorescent lamps with certain of said components being lamp connectors and others of said components being ballasts therefore in order to provide a fixture for receiving fluorescent tubes.

9. The system of claim 1 wherein the said conductive member is a shaped and formed cantilevered metal sheet element which is flexed when compressively held between said terminal and said conductor.

10. The system of claim 1 wherein the said exposed planar circuit comprises a flat, flexible, multiconductor cable, where the conductors are disposed in essentially parallel fashion within an insulating medium.

* * * * *